(12) United States Patent
Nagano

(10) Patent No.: US 7,294,819 B2
(45) Date of Patent: Nov. 13, 2007

(54) SOLID STATE IMAGE SENSOR INCLUDING TRANSPARENT FILM LAYERS EACH HAVING A CONVEX LENS-SHAPED PORTION WITH INCREASED LIGHT INTAKE EFFICIENCY AND MANUFACTURING METHOD THEREFOR

(75) Inventor: Akihiko Nagano, Ichihara (JP)

(73) Assignee: Canon Kabushiki Kaisha, Shimomaruko, Ohta-ku, Tokyo (JP)

( * ) Notice: Subject to any disclaimer, the term of this patent is extended or adjusted under 35 U.S.C. 154(b) by 29 days.

(21) Appl. No.: 11/336,712

(22) Filed: Jan. 19, 2006

(65) Prior Publication Data
US 2006/0157642 A1    Jul. 20, 2006

(30) Foreign Application Priority Data
Jan. 19, 2005    (JP)    ............................. 2005-011795

(51) Int. Cl.
*H01L 27/00*    (2006.01)
(52) U.S. Cl. .................................. 250/208.1; 250/239

(58) Field of Classification Search ............. 250/208.1, 250/239, 214 R, 214.1; 257/432–435; 348/340, 348/273
See application file for complete search history.

(56) References Cited

U.S. PATENT DOCUMENTS
5,371,397 A * 12/1994 Maegawa et al. ........... 257/432

FOREIGN PATENT DOCUMENTS
JP    11-274443    10/1999
JP    2000-164839    6/2000

* cited by examiner

*Primary Examiner*—Que T Le
(74) *Attorney, Agent, or Firm*—Morgan & Finnegan, LLP

(57)    ABSTRACT

Light incident on a microlens at a large incident angle can be efficiently guided to a photo-electric converting portion in a solid state image sensor. In a solid state image sensor having a plurality of pixels, each of the plurality of pixels includes a microlens which condenses light, a photo-electric converting portion which photoelectrically converts light condensed by the microlens, a metal electrode layer which is interposed between the microlens and the photo-electric converting portion and has an opening at a position corresponding to the optical path of light traveling from the microlens toward the photo-electric converting portion, and a transparent film layer which is interposed between the microlens and the photo-electric converting portion and has a convex lens-shaped portion that is convex on the microlens side.

5 Claims, 9 Drawing Sheets

F I G. 1
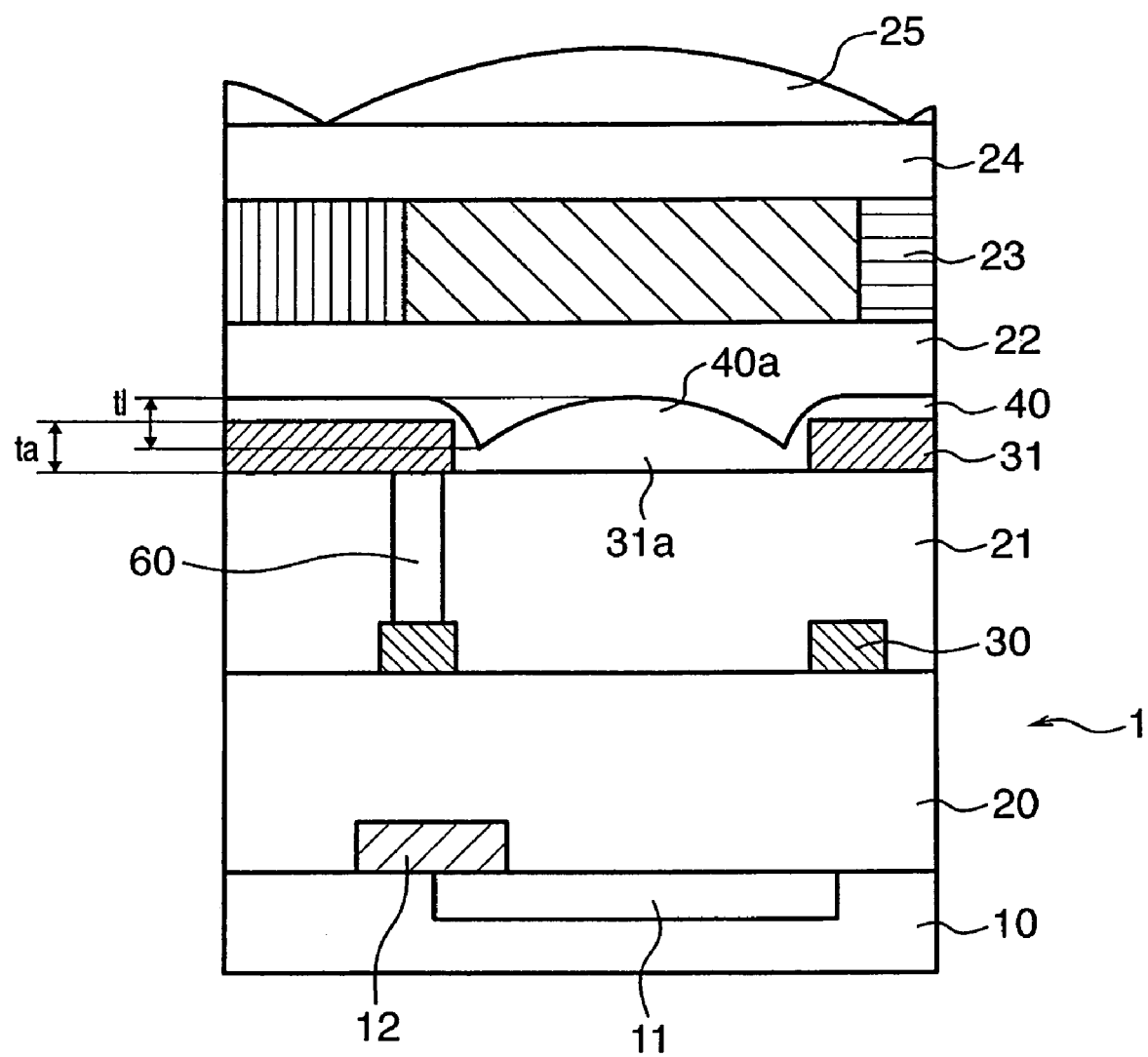

SOLID STATE IMAGE SENSOR INCLUDING TRANSPARENT FILM LAYERS EACH HAVING A CONVEX LENS-SHAPED PORTION WITH INCREASED LIGHT INTAKE EFFICIENCY AND MANUFACTURING METHOD THEREFOR

FIELD OF THE INVENTION

The present invention relates to a technique of increasing the light intake efficiency of a solid state image sensor used in an image capturing apparatus such as a digital still camera.

BACKGROUND OF THE INVENTION

These days, the prices of digital still cameras continue to drop. One reason for this is that the chip size of a solid state image sensor is becoming small. As the chip size of the solid state image sensor decreases, an image sensing unit including a photographing optical system becomes small. For further downsizing, the photographing optical system itself is made compact. In order to downsize the photographing optical system, the exit pupil of the photographing optical system must be arranged close to the solid state image sensor. As a result, the inclination angle (incident angle), to the optical axis, of light incident on the periphery of the input portion of the solid state image sensor becomes large. A large incident angle of light incident on the solid state image sensor inhibits light from reaching a photo-electric converting portion.

To prevent this problem, for example, in a solid state image capturing apparatus disclosed in Japanese Patent Laid-Open No. 11-274443, a planoconvex lens is interposed between the on-chip microlens and photo-electric converting portion of the solid state image capturing apparatus so as to be convex on the side of the photo-electric converting portion. This structure can increase the light intake efficiency at a wide light incident angle even in a solid state image capturing apparatus having a small-area photo-electric converting portion.

Japanese Patent Laid-Open No. 2000-164839 discloses a solid state image capturing apparatus in which a convex lens is arranged immediately above the photo-electric converting portion.

However, in the solid state image capturing apparatus disclosed in Japanese Patent Laid-Open No. 11-274443, the planoconvex lens interposed between the on-chip microlens and the photo-electric converting portion is convex on the side of the photo-electric converting portion. Part of light reaching at a large incident angle is totally reflected by the convex lens portion, and light cannot be effectively guided to the photo-electric converting portion.

As one method of preventing total reflection by the convex lens portion, a planoconvex lens 40 which is convex on the side of an on-chip microlens 25 is interposed between the on-chip microlens 25 and a photo-electric converting portion 11, as shown in FIG. 9 which is a sectional view showing a solid state image sensor 200. If the planoconvex lens 40 is formed after a metal electrode layer 31 and protective layer 41 are formed, it projects from the protective layer 41 toward the on-chip microlens 25. The distance between the on-chip microlens 25 and the planoconvex lens 40 becomes long, increasing the distance between the on-chip microlens 25 and the photo-electric converting portion 11. It becomes difficult to guide light at a large incident angle to the photo-electric converting portion 11.

In the solid state image capturing apparatus disclosed in Japanese Patent Laid-Open No. 2000-164839, the convex lens is formed immediately above the photo-electric converting portion, i.e., near the photo-electric converting portion. The convex lens hardly contributes to condensing light incident on the photo-electric converting portion.

SUMMARY OF THE INVENTION

The present invention has been made to overcome the conventional drawbacks, and has as its object to efficiently guide light incident on a microlens at a large incident angle to a photo-electric converting portion in a solid state image sensor.

In order to solve the above problems and achieve the above object, according to the first aspect of the present invention, a solid state image sensor having a plurality of pixels is characterized in that each of the plurality of pixels comprises a microlens which condenses light, a photo-electric converting portion which photoelectrically converts light condensed by the microlens, metal layers each of which is interposed between the microlens and the photo-electric converting portion and has an opening at a position corresponding to an optical path of light traveling from the microlens toward the photo-electric converting portion, and a transparent film layer which is interposed between the microlens and the photo-electric converting portion and has a convex lens-shaped portion that is convex on a side of the microlens, and at least part of the convex lens-shaped portion in a direction of thickness extends into the opening formed in at least one metal layer among the metal layers.

According to the second aspect of the present invention, a method of manufacturing a solid state image sensor comprises a photo-electric converting portion formation step of forming, on a silicon substrate, a photo-electric converting portion which photoelectrically converts incident light, a metal layer formation step of forming, above the photo-electric converting portion, a metal layer having an opening at a position corresponding to an optical path of light incident on the photo-electric converting portion, a transparent film layer formation step of forming, on the metal layer, a transparent film layer having, at a position corresponding to the opening, a convex lens-shaped portion which is convex in a direction opposite to the photo-electric converting portion, so as to make at least part of the convex lens-shaped portion in a direction of thickness extend into the opening, and a microlens formation step of forming, above the transparent film layer, a microlens which condenses light to the photo-electric converting portion.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 1 is a schematic side sectional view showing a CMOS solid state image sensor according to the first embodiment;

DETAILED DESCRIPTION OF THE PREFERRED EMBODIMENTS

Figure 2A:
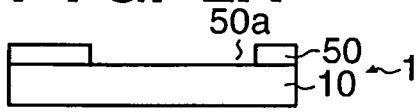
FIGS. 2A to 2K are sectional views for explaining a process of manufacturing the CMOS solid state image sensor according to the first embodiment.

Preferred embodiments of the present invention will be described in detail below with reference to the accompanying drawings.

First Embodiment

FIGS. 1, 2A to 2K, and 3L to 3P are views showing a solid state image sensor according to the first embodiment of the present invention. FIG. 1 is a schematic side sectional view showing a CMOS solid state image sensor. FIGS. 2A to 2K and 3L to 3P are sectional views for explaining a process of manufacturing the CMOS solid state image sensor.

The structure of the CMOS solid state image sensor according to the first embodiment will be explained with reference to FIG. 1.

A solid state image sensor used for a digital camera or the like is made up of several million pixels. FIG. 1 shows the section of one pixel of a solid state image sensor 1.

Light incident on the solid state image sensor 1 is condensed by an on-chip microlens 25. Light passes through a planarization layer 24, color filter layer 23, planarization layer 22, silicon nitride film layer 40, and interlayer dielectric film layers 21 and 20. Then, light is guided to a photo-electric converting portion 11 formed in a silicon substrate 10.

In FIG. 1, reference numeral 12 denotes a polysilicon electrode serving as a first electrode for transferring charges generated in the photo-electric converting portion 11. Second and third electrodes 30 and 31 for selectively outputting transferred charges outside the solid state image sensor are respectively formed on the interlayer dielectric film layers 20 and 21. The second and third electrodes 30 and 31 are generally formed from a metal such as aluminum. Reference numeral 60 denotes a via which connects the second and third electrodes 30 and 31.

In the solid state image sensor 1 according to the first embodiment, the silicon nitride film layer 40 covers the third electrode 31 in order to function as a conventional protective layer, too. At an opening 31a of the metal electrode layer 31, a lens portion 40a which is convex on the light incident side is formed in a region where light condensed by the on-chip microlens 25 passes. Light condensed by the on-chip microlens 25 is deflected toward the photo-electric converting portion 11 by the convex lens portion 40a of the silicon nitride film layer 40. Even light incoming at a large incident angle to the convex lens portion 40a can be efficiently guided to the photo-electric converting portion 11. Since the convex lens portion 40a is convex on the light incident side, no total reflection of incident light occurs on the surface of the convex lens.

A thickness t1 of the convex lens portion 40a of the silicon nitride film layer 40 is set almost equal to a thickness ta of the third electrode 31. Hence, the flatness is good, which facilitates planarization processing after the convex lens portion 40a of the silicon nitride film layer 40 is formed.

FIGS. 2A to 2K and 3L to 3P are sectional views for explaining a process of manufacturing the CMOS solid state image sensor 1 according to the first embodiment. FIGS. 2A to 2K and 3L to 3P illustrate the sectional structure of one pixel around the center of the frame of the solid state image sensor 1.

A silicon substrate 10 is thermally oxidized to form a silicon oxide film SiO (not shown) on the surface of the silicon substrate 10. In order to form a photo-electric converting region in the silicon substrate 10, a photoresist 50 is applied, exposed via a photomask of a predetermined pattern, and developed. For a positive photoresist, development processing dissolves the photoresist 50 in a region irradiated with light, i.e., a region 50a corresponding to the photo-electric converting region. As shown in FIG. 2A, part of the silicon oxide film SiO is exposed. Ions are implanted into the silicon substrate 10 to form a photo-electric converting portion 11.

After the photo-electric converting portion 11 is formed in the silicon substrate 10, the process advances to a step of forming, on the surface of the silicon substrate 10, a first electrode 12 for transferring charges generated in the photo-electric converting portion 11.

Figure 2B:
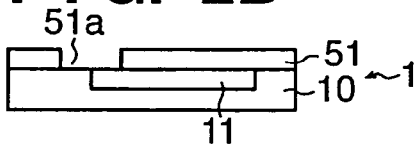
Figure 2C:
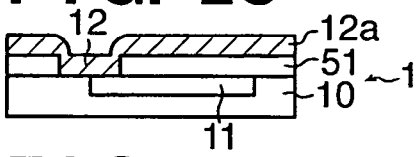

A photoresist 51 is applied to the surface of the silicon substrate 10, covered with a photomask (not shown), and exposed. The photomask is designed to transmit light in a region corresponding to the first electrode 12 which covers part of the photo-electric converting portion 11, and shield light in the remaining region. By developing the photoresist 51, the photoresist 51 in a region irradiated with light, i.e., a region 51a corresponding to the first electrode 12 dissolves. As shown in FIG. 2B, part of the silicon oxide film SiO is exposed. As shown in FIG. 2C, a polysilicon film 12a is formed, and the photoresist 51 is stripped to form the first electrode 12.

Figure 2D:
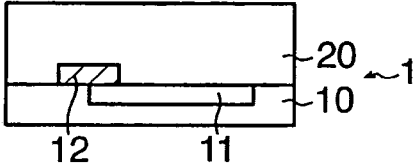

After the first electrode 12 is formed, a first interlayer dielectric film layer 20 for forming a second electrode 30 is formed and planarized, as shown in FIG. 2D. The first interlayer dielectric film layer 20 is formed from a silicon oxide film $SiO_2$ at a refractive index of about 1.46.

Then, the process advances to a step of forming a second electrode 30.

Figure 2E:
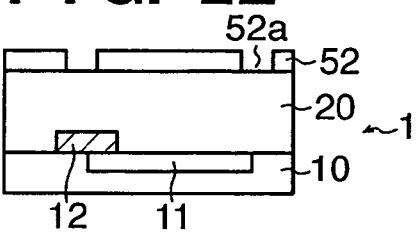

A photoresist 52 is applied, covered with a photomask corresponding to the pattern of the second electrode 30, exposed, and developed. By developing the photoresist 52, the photoresist 52 in a region irradiated with light, i.e., a region 52a corresponding to the second electrode 30 dissolves. As shown in FIG. 2E, part of the first interlayer dielectric film layer 20 is exposed.

Figure 2F:
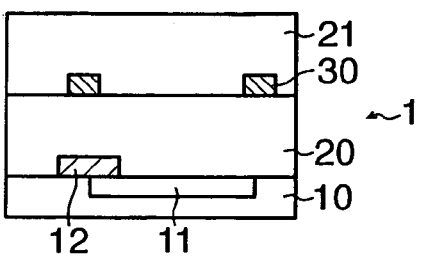

Aluminum Al is deposited by a CVD apparatus or the like, and the photoresist 52 is stripped to form the second electrode 30. As shown in FIG. 2F, a second interlayer dielectric film layer 21 for forming a third electrode 31 is formed from a silicon oxide film $SiO_2$ on the second electrode 30.

Thereafter, the process advances to a step of forming a via 60 for connecting the second and third electrodes 30 and 31.

Figure 2G:
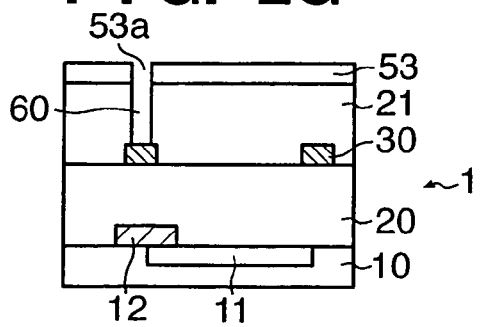

A photoresist 53 is applied, covered with a photomask corresponding to the position of the via 60, exposed, and developed. By developing the photoresist 53, the photoresist 53 in a region irradiated with light, i.e., a region 53*a* corresponding to the via 60 dissolves to expose part of the second interlayer dielectric film layer 21. Dry etching is performed to form the via 60 in the second interlayer dielectric film layer 21, as shown in FIG. 2G. A metal plug 60*a* is buried in the via 60.

The process advances to a step of forming a third electrode 31.

Figure 2H:
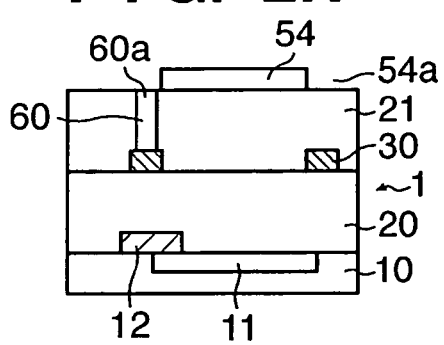

A photoresist 54 is applied, covered with a photomask corresponding to the pattern of the third electrode 31, exposed, and developed. By developing the photoresist 54, the photoresist 54 in a region irradiated with light, i.e., a region 54*a* corresponding to the third electrode 31 dissolves to expose part of the second interlayer dielectric film layer 21, as shown in FIG. 2H.

Figure 2I:
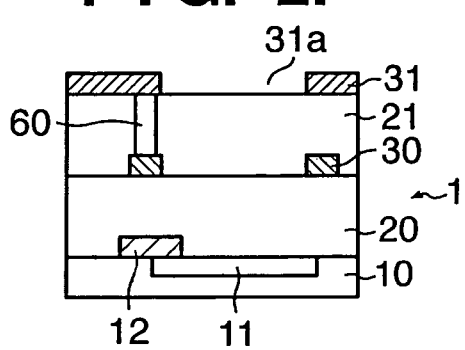

Aluminum Al is deposited by the CVD apparatus or the like, and the photoresist 54 is stripped to form the third electrode 31, as shown in FIG. 2I.

The process advances to a step of forming a silicon nitride film layer 40 at a predetermined thickness so as to function as a protective layer, too, and forming, in the opening 31*a* of the third electrode 31, a convex lens portion 40*a* for increasing the condensing efficiency.

First, the silicon nitride film layer 40 is formed at a predetermined thickness on the third electrode 31.

Figure 2J:
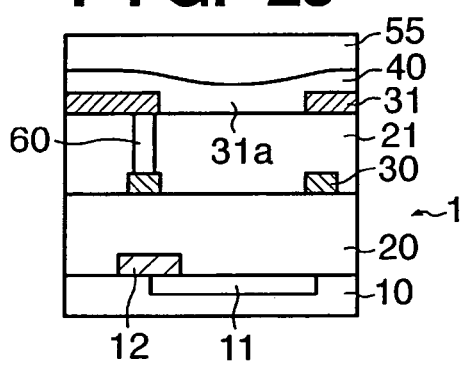
Figure 2K:
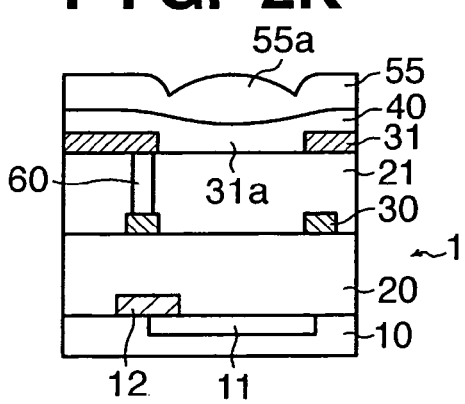

Then, in order to form the convex lens portion 40*a* in the opening 31*a* of the third electrode 31, a photoresist 55 is applied onto the silicon nitride film layer 40 and planarized, as shown in FIG. 2J. As shown in FIG. 2K, the photoresist 55 is exposed and developed via a photomask for forming a convex lens.

Figure 3L:
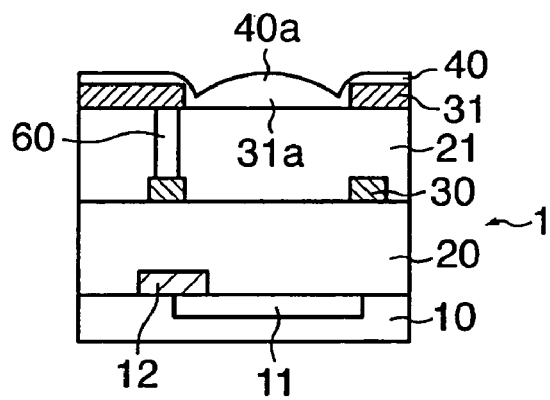
FIGS. 3L to 3P are sectional views for explaining the process of manufacturing the CMOS solid state image sensor according to the first embodiment.

After the photoresist 55 in a region 55*a* corresponding to the opening 31*a* of the electrode 31 is formed into a predetermined convex lens shape, dry etching is performed to transfer the convex lens shape of the photoresist 55 to the silicon nitride film layer 40, as shown in FIG. 3L. At this time, the vertex of the convex lens portion 40*a* formed in the silicon nitride film layer 40 is designed on the light incident side opposite to the surface of the third electrode 31. The silicon nitride film layer 40 covers the third electrode 31 and interlayer dielectric film layer 21, and functions as a protective layer.

Figure 3O:
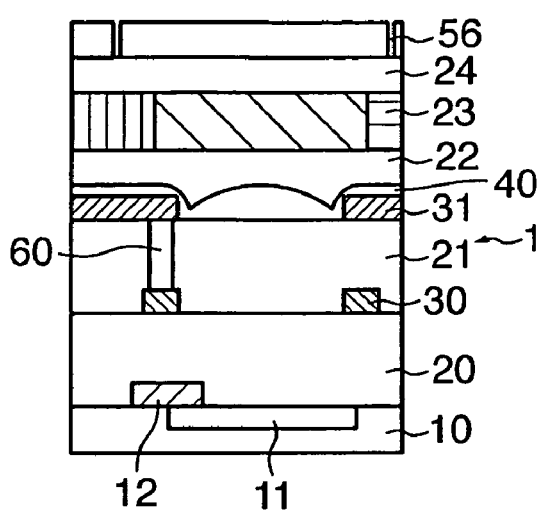
Figure 3M:
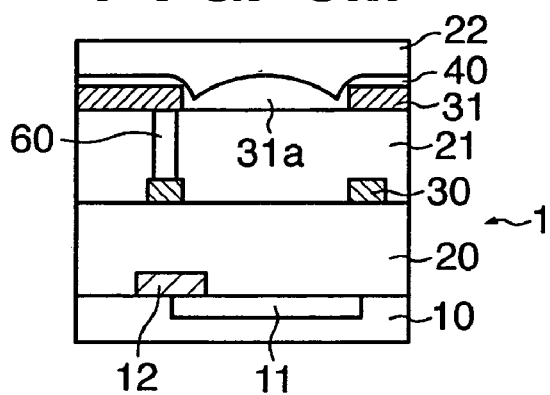
Figure 3P:
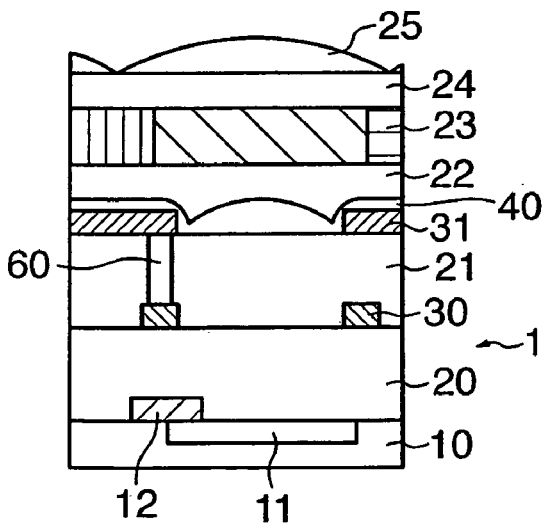

As shown in FIG. 3M, a planarization layer 22 for forming a color filter layer 23 is formed. At this time, the flatness is relatively good because the silicon nitride film layer 40 is buried in the opening 31*a* of the third electrode 31. The planarization layer 22 suffices to be thin, which contributes to an increase in light intake efficiency.

Figure 3N:
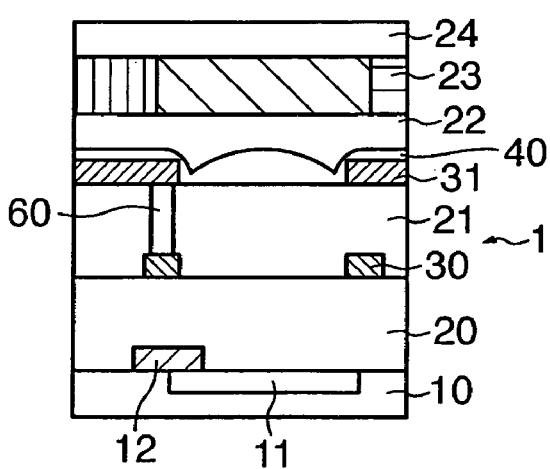

As shown in FIG. 3N, the color filter layer 23 is formed, and a planarization layer 24 for forming an on-chip microlens is formed on the color filter layer 23.

As shown in FIG. 3O, a photoresist 56 for forming the on-chip microlens 25 is formed, covered with a photomask corresponding to the shape of the on-chip microlens, exposed, and developed (FIG. 3O).

The photoresist 56 is thermally fused to form the on-chip microlens 25.

Second Embodiment

Figure 4:
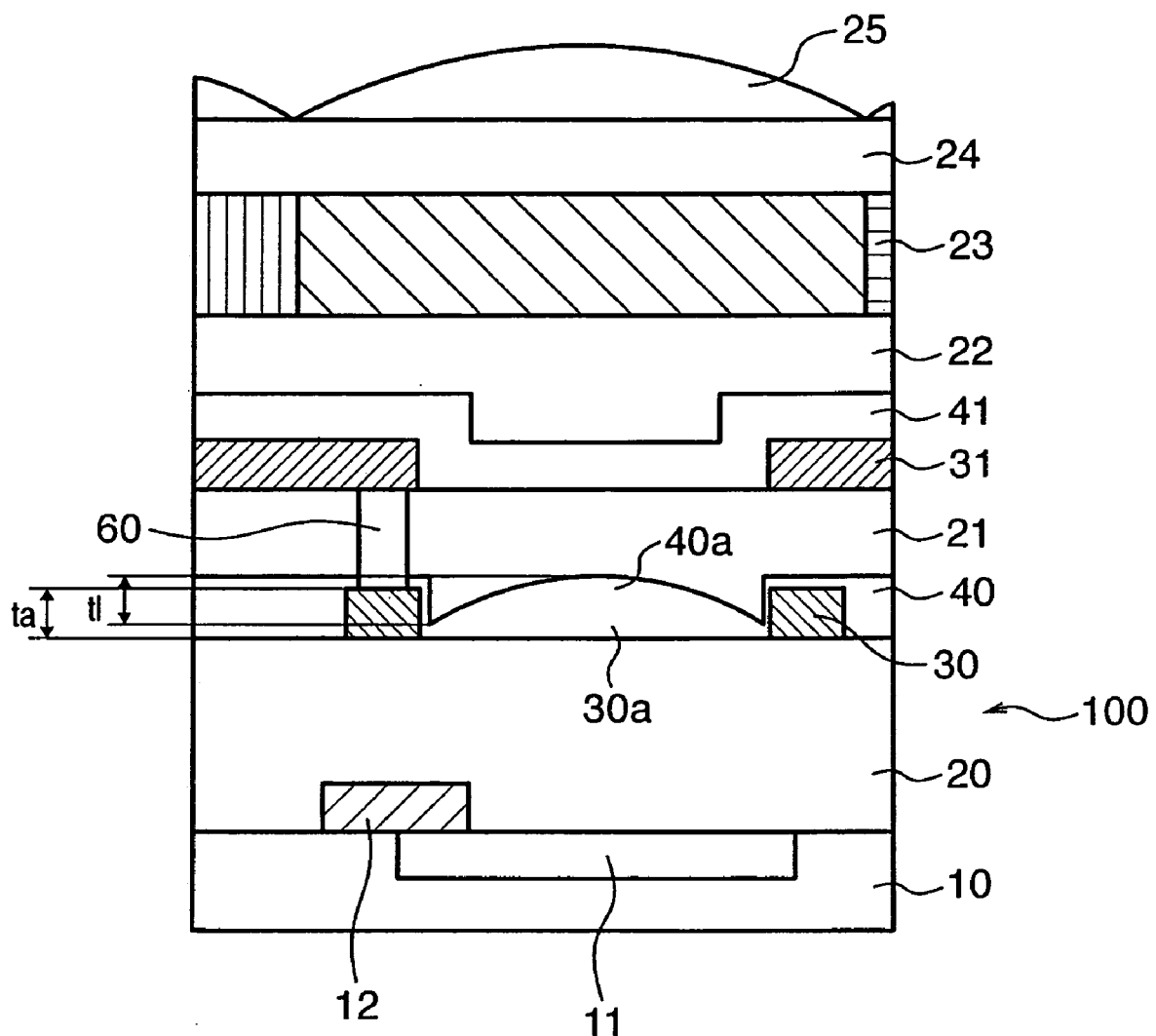
FIG. 4 is a schematic side sectional view showing a CMOS solid state image sensor according to the second embodiment.

FIGS. 4, 5A to 5L, 6M to 6Q, and 7 are views showing a solid state image sensor according to the second embodiment of the present invention. FIG. 4 is a schematic side sectional view showing a CMOS solid state image sensor. FIGS. 5A to 5L and 6M to 6Q are sectional views for explaining a process of manufacturing the CMOS solid state image sensor. FIG. 7 is a schematic plan view showing one pixel of the CMOS solid state image sensor. In the second embodiment, the same reference numerals denote the same functional members as those in the first embodiment.

The structure of the CMOS solid state image sensor according to the second embodiment will be explained with reference to FIG. 4.

Light incident on a solid state image sensor 100 is condensed by an on-chip microlens 25. Light passes through a planarization layer 24, color filter layer 23, planarization layer 22, protective layer 41, interlayer dielectric film layer 21, silicon nitride film layer 40, and interlayer dielectric film layer 20. Then, light is guided to a photo-electric converting portion 11 formed in a silicon substrate 10.

In FIG. 4, reference numeral 12 denotes a polysilicon electrode serving as a first electrode for transferring charges generated in the photo-electric converting portion 11. Second and third electrodes 30 and 31 for selectively outputting transferred charges outside the solid state image sensor are respectively formed on the interlayer dielectric film layers 20 and 21. The second and third electrodes 30 and 31 are generally formed from a metal such as aluminum. Reference numeral 60 denotes a via which connects the second and third electrodes 30 and 31.

In the solid state image sensor 100 according to the second embodiment, the silicon nitride film layer 40 covers the second electrode 30. At an opening 30*a* of the second electrode 30, a convex lens portion 40*a* is formed on the light incident side in a region where light condensed by the on-chip microlens 25 passes. Light condensed by the on-chip microlens 25 is deflected toward the photo-electric converting portion 11 by the convex lens portion 40*a* of the silicon nitride film layer 40. Even light incoming at a large incident angle to the convex lens portion 40*a* can be efficiently guided to the photo-electric converting portion 11. Since the convex lens portion 40*a* is convex on the light incident side, no total reflection of incident light occurs on the surface of the convex lens 40*a*.

A thickness t1 of the convex lens portion 40*a* of the silicon nitride film layer 40 is set almost equal to a thickness ta of the second electrode 30. The flatness is good, which facilitates planarization processing after the convex lens portion 40*a* of the silicon nitride film layer 40 is formed.

FIGS. 5A to 5L and 6M to 6Q are sectional views for explaining a process of manufacturing the CMOS solid state image sensor 100 according to the second embodiment. FIGS. 5A to 5L and 6M to 6Q illustrate the sectional structure of one pixel around the center of the frame of the solid state image sensor 100.

Figure 5A:
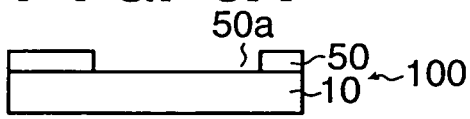
FIGS. 5A to 5L are sectional views for explaining a process of manufacturing the CMOS solid state image sensor according to the second embodiment.
Figure 6M:
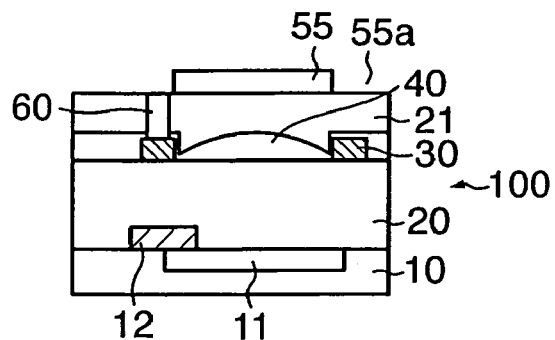
FIGS. 6M to 6Q are sectional views for explaining the process of manufacturing the CMOS solid state image sensor according to the second embodiment.
Figure 6P:
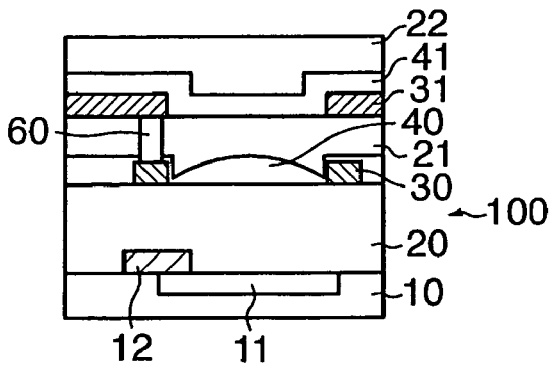

A silicon substrate 10 is thermally oxidized to form a silicon oxide film SiO (not shown) on the surface of the silicon substrate 10. In order to form a photo-electric converting region in the silicon substrate 10, a photoresist 50 is applied, exposed via a photomask of a predetermined pattern, and developed. For a positive photoresist, development processing dissolves the photoresist 50 in a region irradiated with light, i.e., a region 50*a* corresponding to the photo-electric converting region. As shown in FIG. 5A, part of the silicon oxide film SiO is exposed. Ions are implanted into the silicon substrate 10 to form a photo-electric converting portion 11.

After the photo-electric converting portion 11 is formed in the silicon substrate 10, the process advances to a step of forming, on the surface of the silicon substrate 10, a first electrode 12 for transferring charges generated in the photo-electric converting portion 11.

Figure 5B:
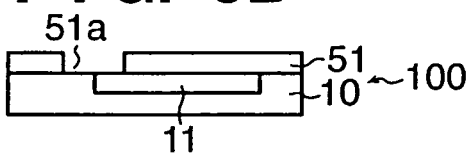
Figure 5C:
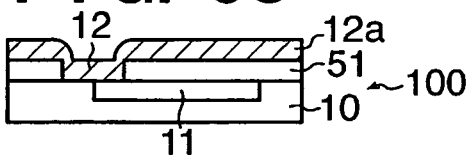

A photoresist 51 is applied to the surface of the silicon substrate 10, covered with a photomask (not shown), and exposed. The photomask is designed to transmit light in a region corresponding to the first electrode 12 which covers part of the photo-electric converting portion 11, and shield light in the remaining region. By developing the photoresist 51, the photoresist 51 in a region irradiated with light, i.e., a region 51a corresponding to the first electrode 12 dissolves. As shown in FIG. 5B, part of the silicon oxide film SiO is exposed. As shown in FIG. 5C, a polysilicon film 12a is formed, and the photoresist 51 is stripped to form the first electrode 12.

Figure 5D:
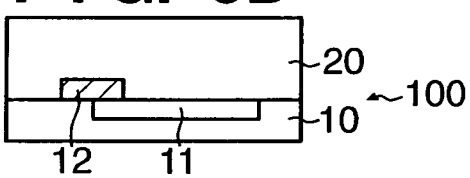

After the first electrode 12 is formed, a first interlayer dielectric film layer 20 for forming a second electrode 30 is formed and planarized, as shown in FIG. 5D. The first interlayer dielectric film layer 20 is formed from a silicon oxide film $SiO_2$ at a refractive index of about 1.46.

Then, the process advances to a step of forming a second electrode 30.

Figure 5E:
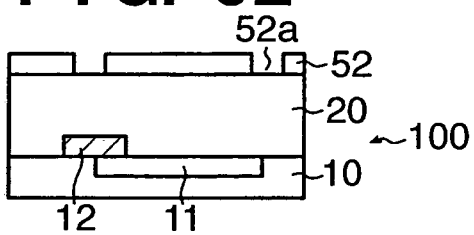

A photoresist 52 is applied, covered with a photomask corresponding to the pattern of the second electrode 30, exposed, and developed. By developing the photoresist 52, the photoresist 52 in a region irradiated with light, i.e., a region 52a corresponding to the second electrode 30 dissolves. As shown in FIG. 5E, part of the first interlayer dielectric film layer 20 is exposed.

Figure 5F:
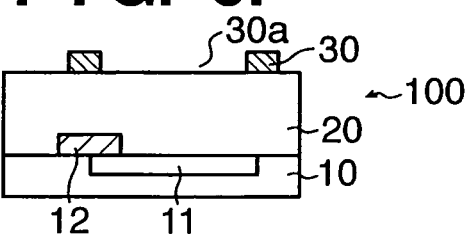

Aluminum Al is deposited by a CVD apparatus or the like, and the photoresist 52 is stripped to form the second electrode 30, as shown in FIG. 5F.

Figure 5G:
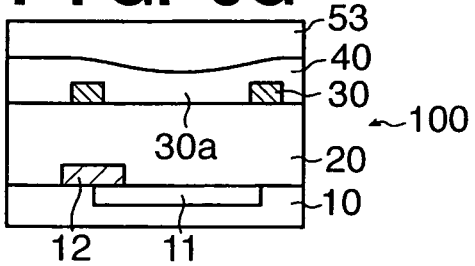

As shown in FIG. 5G, a silicon nitride film layer 40 is formed to have a predetermined thickness to bury the opening 30a of the electrode 30. Further, a convex lens portion 40a for increasing the condensing efficiency is formed in the opening region 30a of the electrode 30 where light condensed by the on-chip microlens 25 passes. For this purpose, a photoresist 53 is applied onto the silicon nitride film layer 40, and planarized.

Figure 5H:
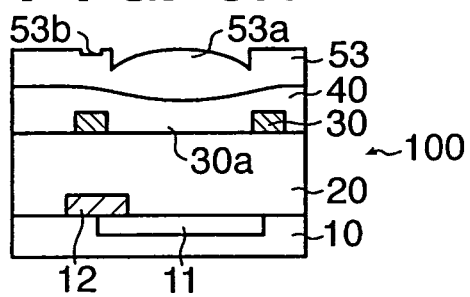

As shown in FIG. 5H, the photoresist 53 is covered with a photomask for forming a convex lens portion 53a and via region 53b in the photoresist 53, exposed, and developed.

Figure 5I:
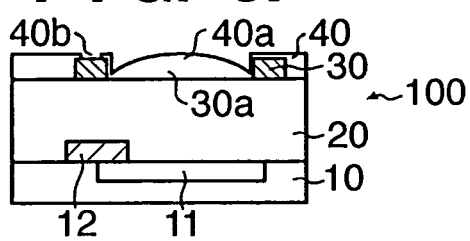

After the predetermined convex lens shape 53a is formed in the photoresist 53 in a region corresponding to the opening 30a of the second electrode 30, and the recess 53b is formed in the photoresist 53 in a region corresponding to the second electrode 30, the convex lens shape 53a and recess 53b of the photoresist 53 are transferred to the silicon nitride film layer 40 by dry etching, as shown in FIG. 5I. At this time, the vertex of the convex lens portion 40a formed in the silicon nitride film layer 40 is designed on the light incident side opposite to the surface of the second electrode 30. A recess 40b formed in the silicon nitride film layer 40 exposes part of the electrode 30 covered with the silicon nitride film layer 40.

FIG. 7 is a plan view showing the solid state image sensor manufacturing step shown in FIG. 5I.

In FIG. 7, the second electrode 30 runs vertically, and the silicon nitride film layer 40 covers the second electrode 30. At the opening 30a of the second electrode 30, the convex lens portion 40a is formed in a region where light condensed by the on-chip microlens 25 passes. The second electrode 30 is exposed in the region 40b where a via is formed between the second and third electrodes 30 and 31. As a result, the flatness improves because the silicon nitride film layer 40 is buried in a stepped region of the second electrode 30.

Figure 5J:
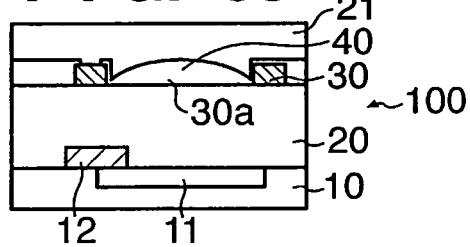

After the silicon nitride film layer 40 is buried in the opening 30a of the second electrode 30, a second interlayer dielectric film layer 21 for forming a third electrode 31 is formed from a silicon oxide film $SiO_2$, as shown in FIG. 5J.

After that, the process advances to a step of forming a via 60 for connecting the second and third electrodes 30 and 31.

Figure 5K:
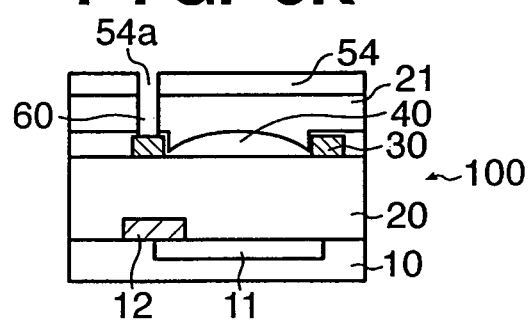
Figure 5L:
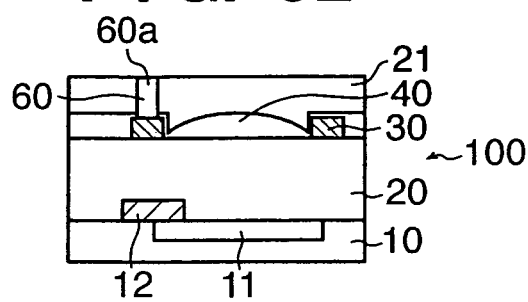

A photoresist 54 is applied, covered with a photomask corresponding to the position of the via, exposed, and developed. By developing the photoresist 54, the photoresist 54 in a region irradiated with light, i.e., a region 54a corresponding to the via 60 dissolves to expose part of the second interlayer dielectric film layer 21. Dry etching is performed to form the via 60 in the second interlayer dielectric film layer 21, as shown in FIG. 5K. A metal plug 60a is buried in the via 60, as shown in FIG. 5L.

The process advances to a step of forming a third electrode 31.

A photoresist 55 is applied, covered with a photomask corresponding to the pattern of the third electrode 31, exposed, and developed. By developing the photoresist 55, the photoresist 55 in a region irradiated with light, i.e., a region 55a corresponding to the third electrode 31 dissolves to expose part of the second interlayer dielectric film layer 21, as shown in FIG. 6M.

Figure 6N:
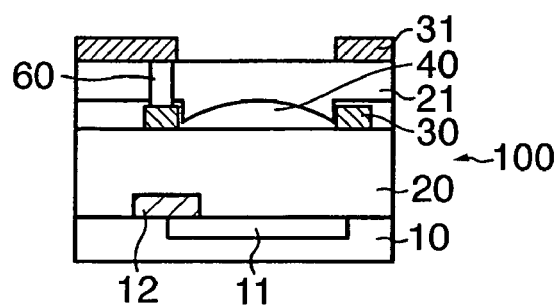
Figure 7:
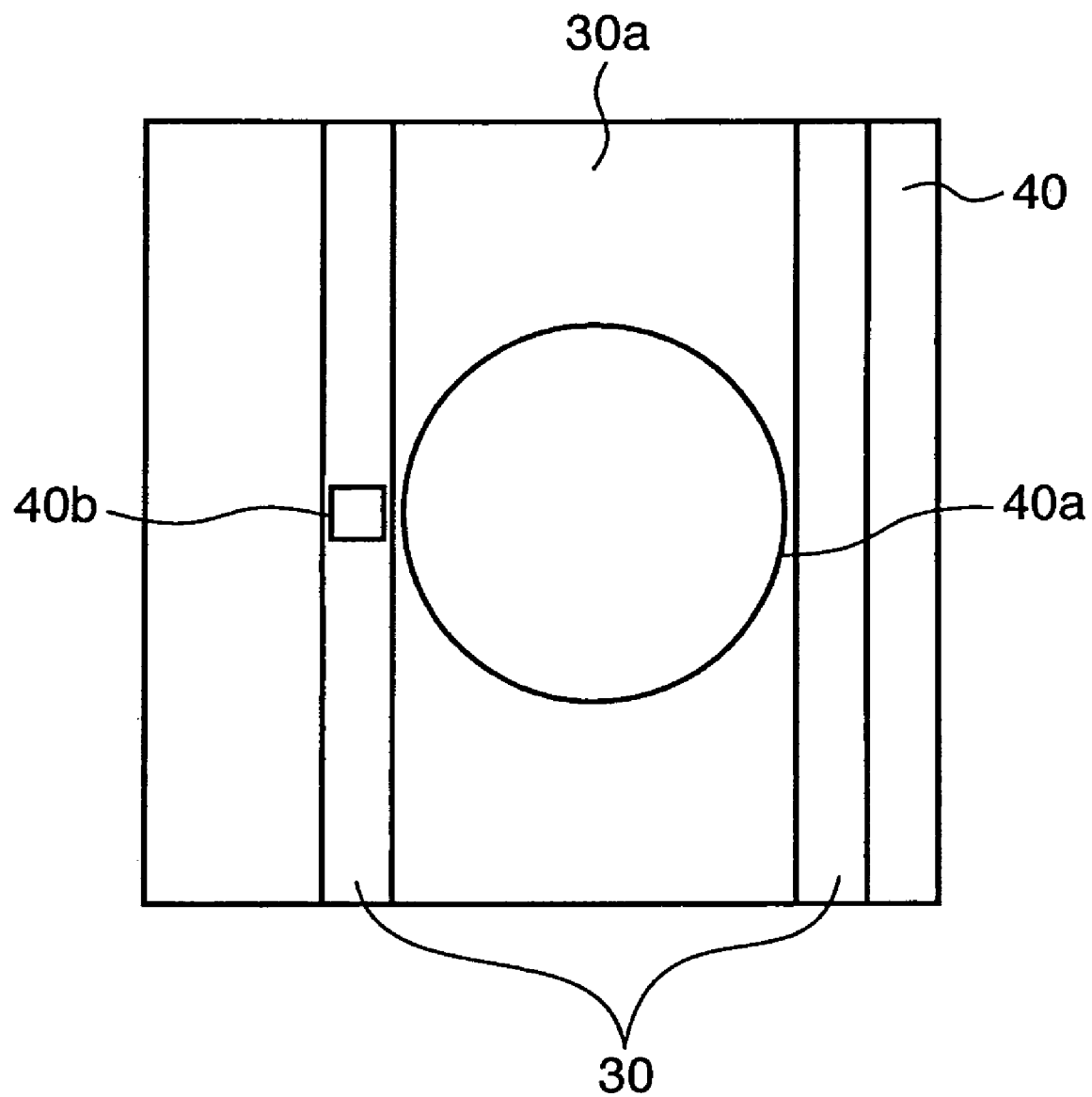
FIG. 7 is a schematic plan view showing one pixel of the CMOS solid state image sensor according to the second embodiment.

Aluminum Al is deposited by the CVD apparatus or the like, and the photoresist 55 is stripped to form the third electrode 31, as shown in FIG. 6N.

Figure 6O:
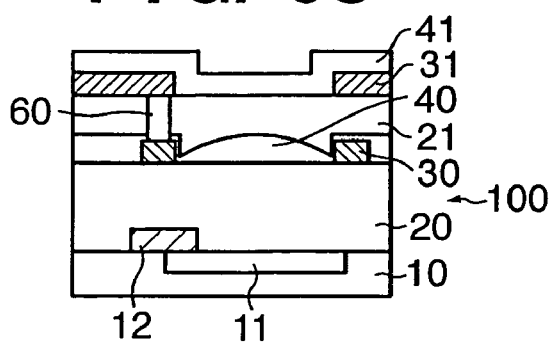

As shown in FIG. 6O, a protective layer 41 is formed. The protective layer 41 is typically formed from a silicon oxynitride film.

As shown in FIG. 6P, a planarization layer 22 for forming a color filter layer is formed.

Figure 6Q:
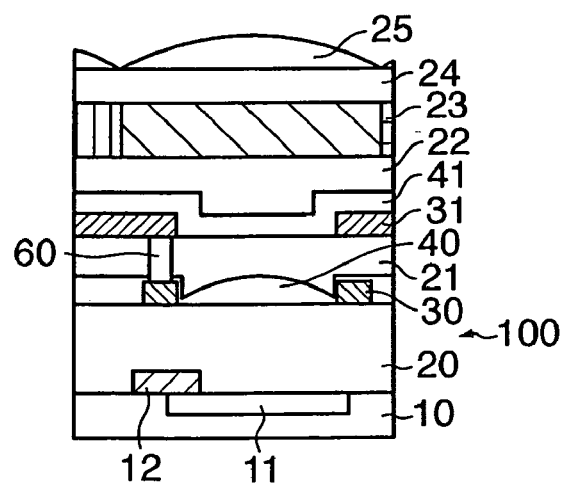

Further, a color filter layer 23 is formed, and a planarization layer 24 for forming an on-chip microlens is formed on the color filter layer 23. As shown in FIG. 6Q, an on-chip microlens 25 is formed on the planarization layer 24. The on-chip microlens 25 is formed by known resist reflow.

Figure 8:
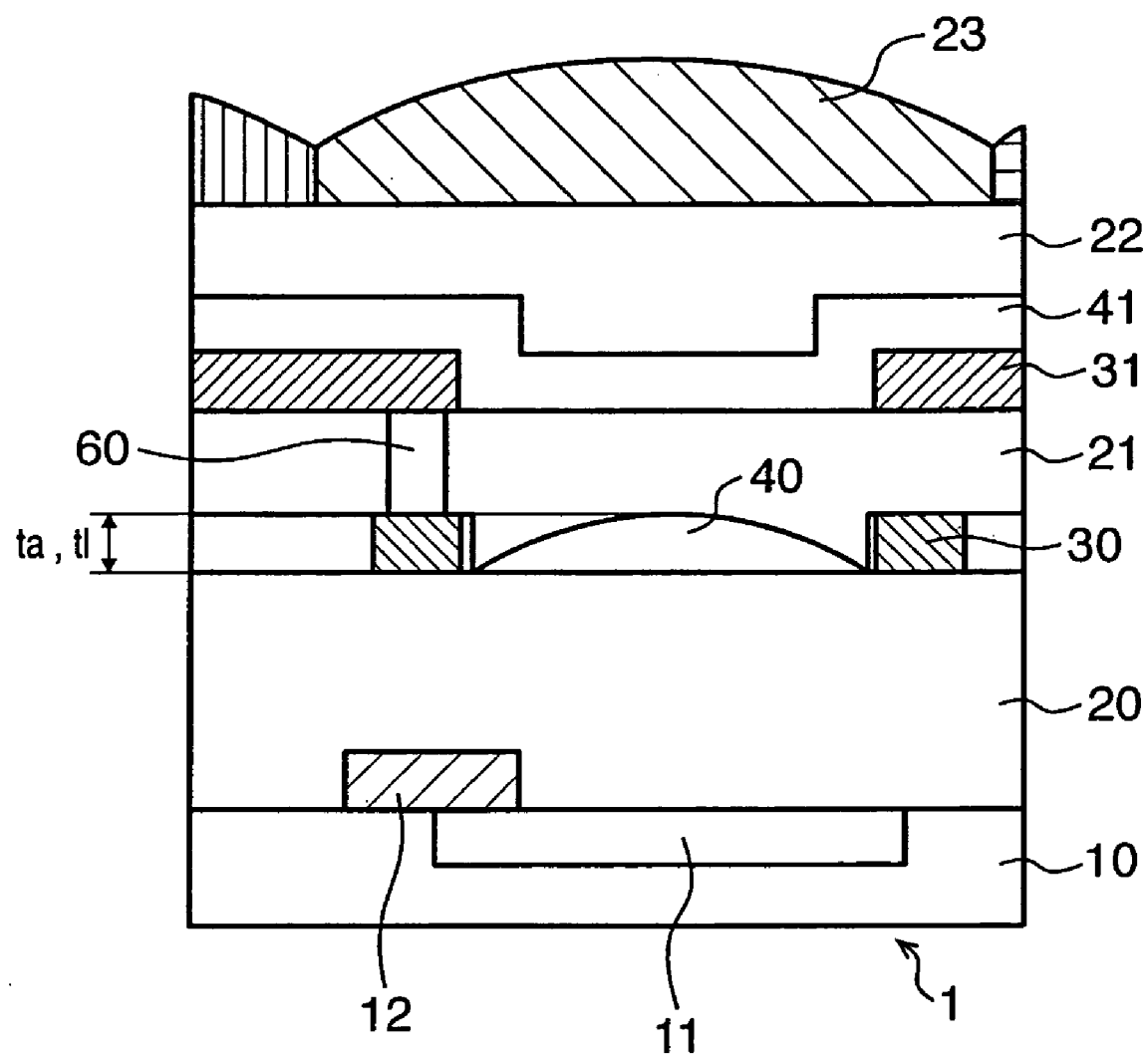
FIG. 8 is a schematic side sectional view showing a modification of the CMOS solid state image sensor.
Figure 9:
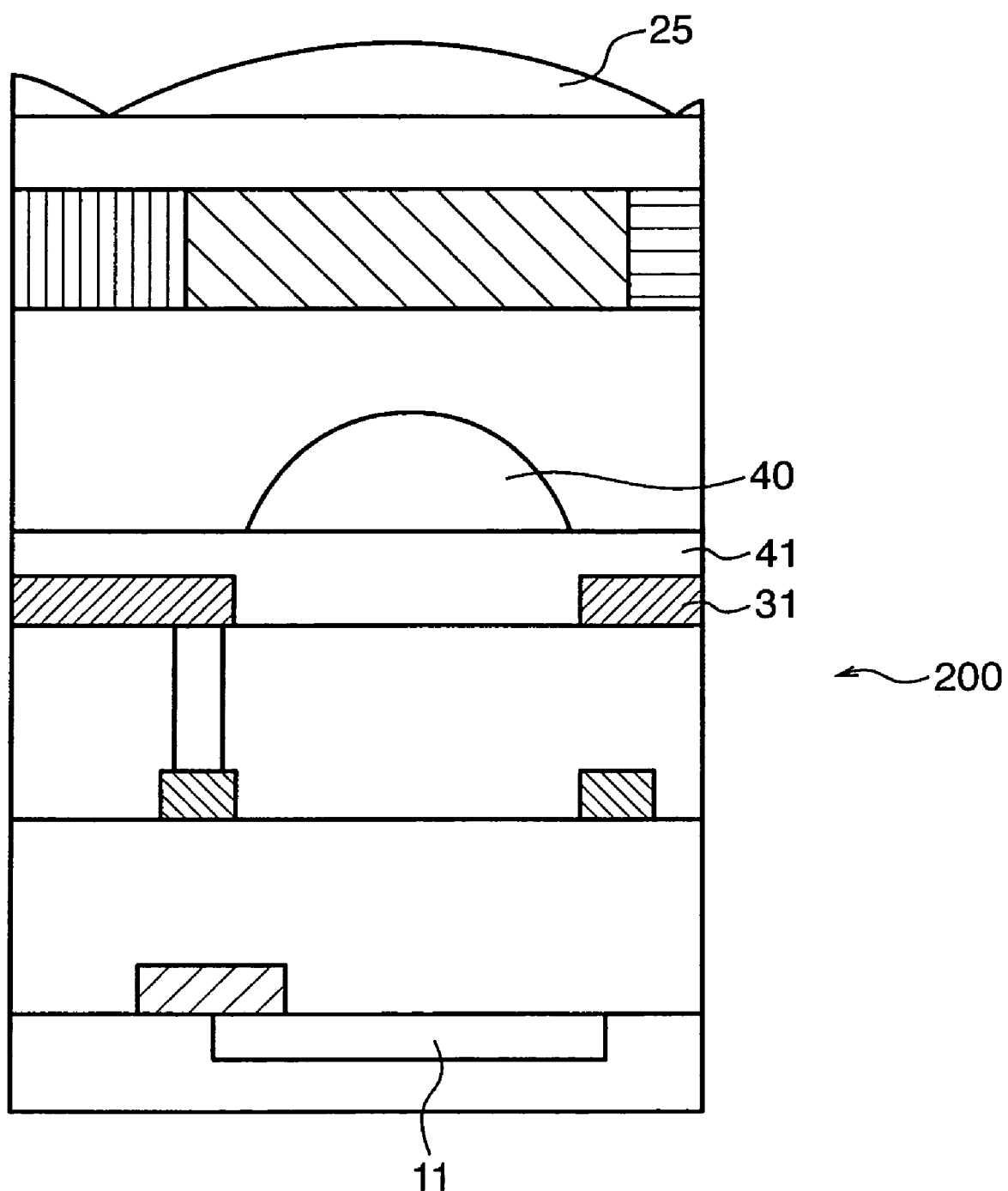
FIG. 9 is a schematic side sectional view showing a CMOS solid state image sensor.

In the second embodiment, the vertex of the convex lens portion 40a formed on the silicon nitride film layer 40 faces the light incident side opposite to the second electrode 30. Alternatively, the vertex of the convex lens portion 40a formed on the silicon nitride film layer 40 may be located on almost the same plane as the surface of the second electrode 30, as shown in FIG. 8 which is a schematic side sectional view showing a CMOS solid state image sensor. This structure can shorten the interval between the second and third electrodes 30 and 31.

As described above, according to the embodiments, a plurality of metal electrode layers are interposed between the on-chip microlens and photo-electric converting portion of a solid state image sensor. On at least one surface having the metal electrode layers, a transparent film layer of high refractive index is formed to have a thickness almost equal to or larger than that of the metal electrode layer. In a region where light having passed through the on-chip microlens passes through the high-refractive-index film layer, the high-refractive-index film layer is formed into a convex lens shape which is convex on the light incident side. This structure can efficiently guide even light incoming at a large incident angle to the photo-electric converting portion while keeping short the distance between the on-chip microlens and the photo-electric converting portion.

Since the lens portion of the high-refractive-index film layer has almost the same thickness as that of the metal electrode layer, planarization processing after formation of the convex lens portion can be facilitated.

Since the high-refractive-index film layer covers the metal electrode layer, a process of newly forming a protective layer can be omitted.

Moreover, an interconnection which connects the plurality of metal electrode layers is arranged, and the high-refractive-index film layer is formed in a region except the interconnection formation region. A convex lens can, therefore, be interposed between the metal electrode layers.

According to the present invention, light incident on the microlens at a large incident angle can be efficiently guided to the photo-electric converting portion in the solid state image sensor.

The present invention is not limited to the above embodiments and various changes and modifications can be made within the spirit and scope of the present invention. Therefore, to apprise the public of the scope of the present invention the following claims are made.

This application claims the benefit of Japanese Patent Application No. 2005-011795 filed on Jan. 19, 2005, which is hereby incorporated by reference herein in its entirety.

What is claimed is:

1. A solid state image sensor having a plurality of pixels, wherein
each of the plurality of pixels comprises
a microlens which condenses light,
a photo-electric converting portion which photoelectrically converts light condensed by the microlens,
metal layers each of which is interposed between the microlens and the photo-electric converting portion and has an opening at a position corresponding to an optical path of light traveling from the microlens toward the photo-electric converting portion, and
a transparent film layer which covers one metal layer among the plurality of metal layers and has a convex lens-shaped portion that is convex on a side of the microlens and is arranged at a position corresponding to the opening formed in the one metal layer, and
at least peripheral portion of the convex lens-shaped portion is positioned below the microlens-side surface of the one metal layer.

2. The sensor according to claim 1, wherein the convex lens-shaped portion has substantially the same thickness as a thickness of the one metal layer.

3. The sensor according to claim 1, wherein
the one metal layer includes a plurality of metal electrode layers,
the pixel further comprises a conductive portion which connects the plurality of metal electrode layers, and
the transparent film layer is formed at a portion except an arrangement region of the conductive portion.

4. A method of manufacturing a solid state image sensor, comprising:
a photo-electric converting portion formation step of forming, on a silicon substrate, a photo-electric converting portion which photoelectrically converts incident light;
a metal layer formation step of forming, above the photo-electric converting portion, a metal layer having an opening at a position corresponding to an optical path of light incident on the photo-electric converting portion;
a transparent film layer formation step of forming, to cover the metal layer, a transparent film layer having, at a position corresponding to the opening, a convex lens-shaped portion which is convex in a direction opposite to the photo-electric converting portion, so as to make at least peripheral portion of the convex lens-shaped portion positioned below the top surface of the metal layer; and
a microlens formation step of forming, above the transparent film layer, a microlens which condenses light to the photo-electric converting portion.

5. The method according to claim 4, wherein in the transparent film layer formation step, the convex lens-shaped portion is formed to have substantially the same thickness as a thickness of the metal layer.

* * * * *